United States Patent
Gouranlou et al.

(10) Patent No.: US 6,379,744 B1
(45) Date of Patent: Apr. 30, 2002

(54) METHOD FOR COATING AN INTEGRATED CIRCUIT SUBSTRATE

(75) Inventors: Hussain Gouranlou, Taylor; Wayne Fowler, Austin, both of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/590,042

(22) Filed: Feb. 5, 1996

(51) Int. Cl.$^7$ .............. B05D 5/12; B05D 3/12; H01L 21/312
(52) U.S. Cl. .......... 427/96; 427/240; 427/402; 438/782
(58) Field of Search .............. 427/96, 240, 346, 427/402, 424, 425; 118/52, 320; 437/231; 438/778, 782

(56) References Cited

U.S. PATENT DOCUMENTS

| | | | | |
|---|---|---|---|---|
| 4,657,629 A | * | 4/1987 | Bigelow | 156/643 |
| 4,748,053 A | * | 5/1988 | Okada | 427/240 |
| 4,996,080 A | * | 2/1991 | Daraktchiev | 427/240 |
| 5,344,748 A | * | 9/1994 | Felley | 430/330 |
| 5,405,813 A | | 4/1995 | Rodrigues | 437/231 |

OTHER PUBLICATIONS

Wolf et al., "Silicon Processing for VLSI Era", vol. 1, Processing Technology, pp. 430–434, 1986.*
David J. Elliot, "Microlithography Process Technology for IC Fabrication", Chapter 3 Resist Resist Coating and Softbake, published 1986, pp. 59–99.
Stanley Wolf et al., "Silicon Processing for the VLSI Era", vol. 1:Process Technology, published by Lattice Press in 1986, pp. 430–434.

* cited by examiner

*Primary Examiner*—Brian K. Talbot
(74) *Attorney, Agent, or Firm*—Kent J. Cooper; Robert A. Rodriguez

(57) ABSTRACT

An integrated circuit substrate (10) is uniformly coated with a defect free layer of material (18), while minimizing the volume of material (18) dispensed on to the integrated circuit substrate (10). In one embodiment a first predetermined quantity of material (18) is dispensed on to the integrated circuit substrate (10) while the integrated circuit substrate (10) is not spinning. After the first predetermined quantity of material (18) is dispensed the integrated circuit substrate (10) is radially accelerated to a first predetermined spin speed. A second predetermined quantity of the material (18) is then dispensed on to the first predetermined quantity of material (18), while the integrated circuit substrate (10) is spinning. After the second predetermined quantity of material (18) is dispensed the integrated circuit substrate (10) is radially accelerated to a second predetermined spin speed.

21 Claims, 2 Drawing Sheets

METHOD FOR COATING AN INTEGRATED CIRCUIT SUBSTRATE

FIELD OF THE INVENTION

This invention relates generally to integrated circuits, and more specifically to a method for coating an integrated circuit substrate with a layer of material.

BACKGROUND OF THE INVENTION

Integrated circuit fabrication requires various materials to be spin-coated on to an integrated circuit substrate. For example, integrated circuit substrates are routinely spin-coated with dielectric layers, such as polyimide and spin-on-glass. Moreover, the lithographic patterning processes that are used throughout the fabrication process require the integrated circuit substrate to be spin-coated with various resist layers. It is essential that the spin-coating process provide a uniform and defect free layer of material on the integrated circuit substrate, otherwise, the reliability and functionality of the resulting integrated circuits will be adversely affected. In order to insure that a uniform and defect free layer of material is achieved, current spin-coating processes dispense a large volume of material, which is in excess of what is actually required, on to the integrated circuit substrate. The excess material is subsequently spun off the integrated circuit substrate, and thus is lost or wasted. Obviously, this process can be quite costly, especially when a material costing several hundred dollars per gallon is being used to coat the integrated circuit substrate. Moreover, there is also the added cost of treating and disposing of the spun off material. Accordingly, a need exists for a method that can coat an integrated circuit substrate with a uniform and defect free layer of material, while minimizing the volume of material required to be dispensed on to the integrated circuit substrate.

DETAILED DESCRIPTION OF A PREFERRED EMBODIMENT

Figure 1:
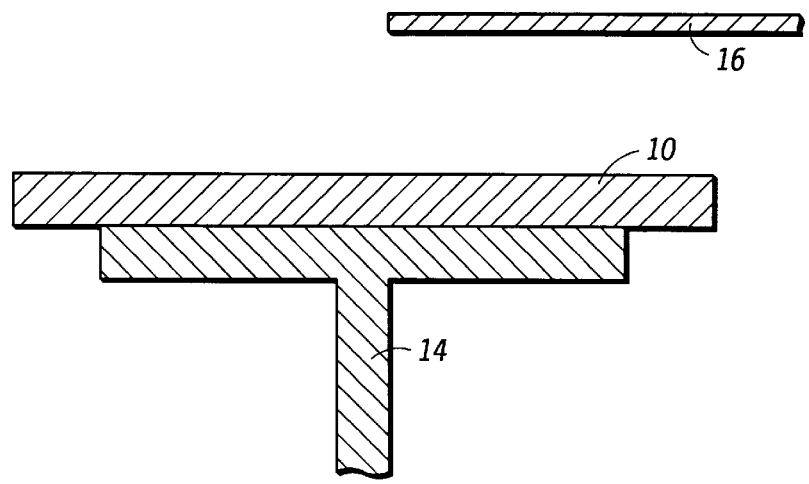
FIGS. 1, 2, 3, 4, and 5 illustrate, in cross-section, process steps in accordance with one embodiment of the invention.

FIGS. 1 through 5 illustrate, in cross-section, one embodiment of the invention wherein an integrated circuit substrate 10 is coated with a layer of material 18. Shown in FIG. 1 is an integrated circuit substrate 10 and a portion of a conventional coating system comprising a rotatable chuck 14 and a dispense tube 16. Integrated circuit substrate 10 is centered on rotatable chuck 14, and during the inventive spin-coating process rotatable chuck 14 applies a vacuum to the back surface of integrated circuit substrate 10 so that integrated circuit substrate 10 remains mounted to rotatable chuck 14. Integrated circuit substrate 10 may be a semiconductor substrate, such as a silicon wafer, a gallium arsenide wafer, a SIMOX wafer, a silicon-on-sapphire wafer, or the like. Alternatively, integrated circuit substrate 10 may be another type of substrate such as a flat panel display.

Figure 2:
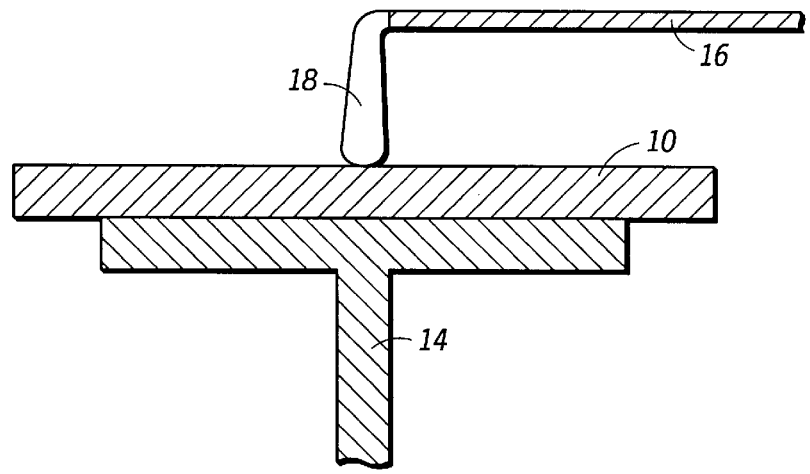

In FIG. 2 dispense tube 16 dispenses a first predetermined quantity of a material 18 on to integrated circuit substrate 10. It is important to note that integrated circuit substrate 10 is not spinning while the first quantity of material 18 is dispensed. Material 18 may be resist, which is used in X-ray, E-beam, or optical lithographic patterning processes. Alternatively, material 18 may be another material, such as an inorganic anti-reflective coating, polyimide, spin-on-glass, or the like. In a preferred embodiment, material 18 is dispensed directly over the center of integrated circuit substrate 10. The quantity of material dispensed will vary depending upon the type of material used, the size of the integrated circuit substrate, and the final coating thickness that is desired. For example, in one embodiment integrated circuit substrate 10 is a five inch silicon wafer, material 18 is Shipley SPR2FX resist, and a final coating thickness of approximately 10,000 angstroms is desired. In such an embodiment, dispense tube 16 dispenses approximately 0.5 cubic centimeters of Shipley SPR2FX resist on to the non-rotating five inch silicon wafer.

Figure 3:
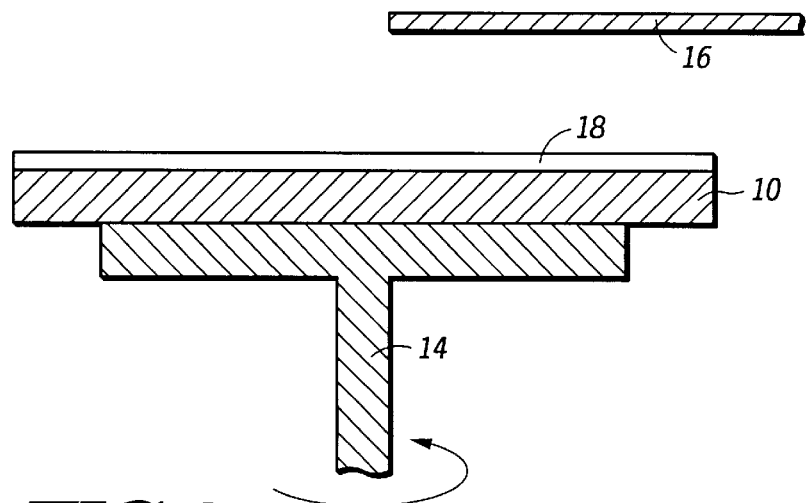

In FIG. 3, after dispense tube 16 ceases dispensing the first predetermined quantity of material 18, integrated circuit substrate 10 and rotatable chuck 14 are then radially accelerated to a first predetermined spin speed to form a layer of the material (18) overlying at least a portion of the integrated circuit substrate (10). The acceleration rate and the spin speed will vary depending upon the type of material used, the size of the integrated circuit substrate, and the final coating thickness that is desired. For example, in the previously discussed embodiment, the acceleration rate of the five inch silicon wafer is approximately 15,000 rpm/sec and the first predetermined spin speed is approximately 2500 rpm. Under these conditions, the five inch silicon wafer achieves the predetermined spin speed in approximately 0.2 seconds.

Figure 4:
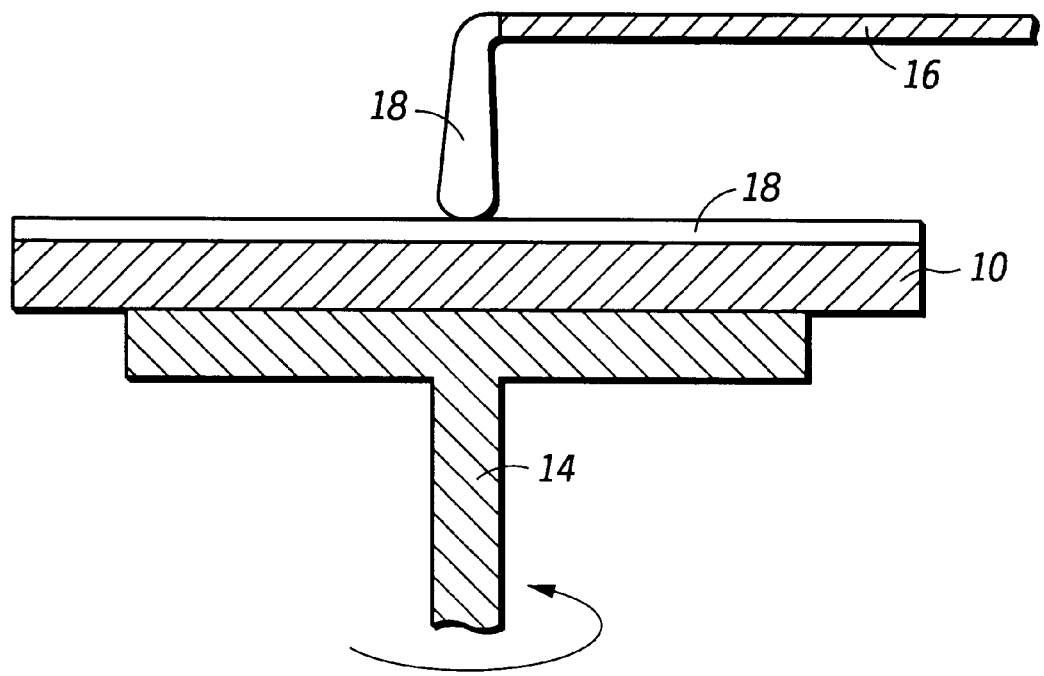

In FIG. 4, after integrated circuit substrate 10 is spinning, dispense tube 16 dispense a second predetermined quantity of material 18 on to the first predetermined quantity of material 18. In a preferred embodiment, the second predetermined quantity of material 18 is dispensed directly over the center of integrated circuit substrate 10. The quantity of material dispensed will vary depending upon the type of material used, the size of the integrated circuit substrate, and the final coating thickness that is desired. For example, in the previously discussed embodiment dispense tube 16 dispenses approximately 0.5 cubic centimeters of Shipley SPR2FX resist on to the previously dispensed 0.5 cubic centimeters of Shipley SPR2FX resist, which is already present on the rotating five inch silicon wafer. Moreover, the time required to dispense the second quantity of material 18 will vary depending on the coating system that is used. The commercially available SVG 8600 coating system, which was used to coat the five inch silicon wafer, can dispense approximately 0.5 cubic centimeters of Shipley SPR2FX resist in approximately 1.3 seconds. Thus, in the foregoing embodiment at least a portion of the second predetermined quantity of material 18 will be dispensed while integrated circuit substrate 10 is spinning at the first predetermined spin speed.

Figure 5:
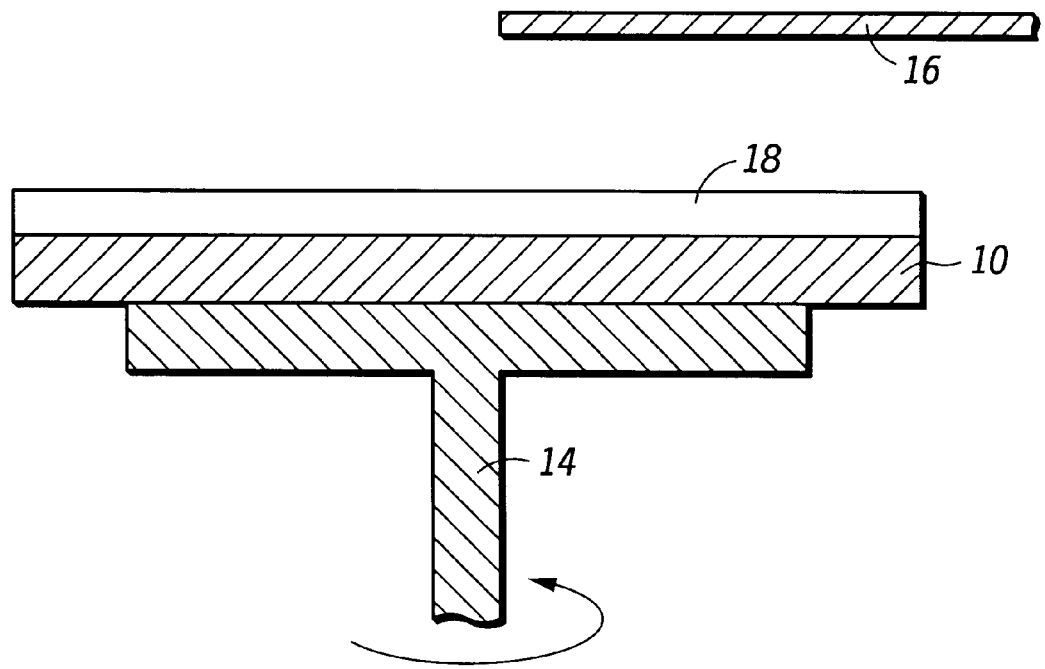

In FIG. 5, after dispense tube 16 ceases dispensing the second predetermined quantity of material 18, integrated circuit substrate 10 and rotatable chuck 14 are radially accelerated to a second predetermined spin speed. Once again, the acceleration rate and the spin speed will vary depending upon the type of material used, the size of the integrated circuit substrate, and the final coating thickness that is desired. For example, in the previously discussed embodiment, the acceleration rate of the five inch silicon wafer is approximately 15,000 rpm/sec and the second predetermined spin speed is approximately 5760 rpm. Under these conditions, the five inch silicon wafer achieves the second predetermined spin speed in approximately 0.2 seconds. The five inch wafer was then held at the second predetermined spin speed for approximately 25 seconds so that a final coating thickness of approximately 10,000 angstroms was achieved.

Using the inventive coating process integrated circuit substrate 10 can be coated with a uniform and defect free layer of material 18. Moreover, this result can be achieved while at the same time minimizing the total volume of material 18 required to be dispensed on to integrated circuit substrate 10. For example, in the foregoing embodiment where integrated circuit substrate 10 is a five inch silicon wafer and material 18 is Shipley SPR2FX resist, the total volume of Shipley SPR2FX resist required to coat the five inch silicon wafer was reduced from approximately 4 cubic centimeters to approximately 1 cubic centimeter using the inventive coating process, and thus the volume of resist required to coat the five inch silicon wafer was reduced by approximately 75 percent. Moreover, it is estimated that the inventive coating process will save just one fabrication facility approximately 400,000 dollars per year in resist costs. Thus, the present invention allows integrated circuit substrate 10 to be coated with a uniform and defect free layer of material 18 at a reduced cost.

Thus it is apparent that there has been provided, in accordance with the present invention, a method for coating an integrated circuit substrate with a layer of material that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is not limited to a specific coating system. Moreover, the invention is not limited to a specific coating material or to a specific final coating thickness. More specifically, the present invention is not limited to specific radial acceleration rates, spin speeds, spin times, dispense times, or dispense volumes. Moreover, the inventive process is not limited to a specific type or size of integrated circuit substrate. Therefore, it is intended that this invention encompass all such variations and modifications as fall within the scope of the appended claims.

What is claimed is:

1. A method for coating an integrated circuit substrate comprising the steps of:
    dispensing a first quantity of a material on the integrated circuit substrate, the integrated circuit substrate having a center, wherein during said dispensing of the first quantity of the material the integrated circuit substrate is not spinning;
    accelerating the integrated circuit substrate to a first predetermined spin speed after dispensing the first quantity of the material; and
    dispensing a second quantity of the material on the first quantity of the material, wherein the second quantity of the material is dispensed while the integrated circuit substrate is spinning.

2. The method of claim 1, further comprising the step of accelerating the integrated circuit substrate to a second predetermined spin speed after dispensing the second quantity of the material.

3. The method of claim 1, wherein the step of dispensing the first quantity of the material is further characterized as dispensing resist.

4. The method of claim 1, wherein the step of dispensing the first quantity of the material is further characterized as dispensing polyimide.

5. The method of claim 1, wherein the step of dispensing the first quantity of the material is further characterized as dispensing spinon-glass.

6. The method of claim 1, wherein the step of dispensing the first quantity of the material is further characterized as dispensing the first quantity of the material over the center of the integrated circuit substrate.

7. The method of claim 1, wherein the step of dispensing the second quantity of the material is further characterized as dispensing the second quantity of the material over the center of the integrated circuit substrate.

8. The method of claim 1, wherein the step of dispensing the second quantity of the material is further characterized as dispensing the second quantity of the material during said step of accelerating the integrated circuit substrate to a first predetermined spin speed.

9. The method of claim 8, wherein the step of dispensing the second quantity of the material is further characterized as dispensing at least a portion of the second quantity of the material after the integrated circuit substrate is spinning at the first predetermined spin speed.

10. A method for coating an integrated circuit substrate comprising the steps of:
    dispensing a first quantity of a material on the integrated circuit substrate, the integrated circuit substrate having a center, wherein the first quantity of the material is dispensed while the integrated circuit substrate is not spinning;
    ceasing said dispensing of the first quantity of the material;
    spinning the integrated circuit substrate after ceasing said dispensing of the first quantity of the material to form a layer of the material overlying at least a portion of the integrated circuit substrate; and
    dispensing a second quantity of the material on the integrated circuit substrate, wherein the second quantity of the material is dispensed while the integrated circuit substrate is spinning.

11. The method of claim 10, wherein the step of dispensing the first quantity of the material is further characterized as dispensing resist.

12. The method of claim 10, wherein the step of dispensing the first quantity of the material is further characterized as dispensing polyimide.

13. The method of claim 10, wherein the step of dispensing the first quantity of the material is further characterized as dispensing spin-on-glass.

14. The method of claim 10, wherein the step of dispensing the first quantity of the material is further characterized as dispensing the first quantity of the material over the center of the integrated circuit substrate.

15. The method of claim 10, wherein the step of dispensing the second quantity of the material is further characterized as dispensing the second quantity of the material over the center of the integrated circuit substrate.

16. The method of claim 10, wherein the step of dispensing the second quantity of the material is further characterized as dispensing the second quantity of the material during said step of spinning the integrated circuit substrate.

17. A method for coating an integrated circuit substrate comprising the steps of:
    dispensing a first quantity of a resist on the integrated circuit substrate, the integrated circuit substrate having a center, wherein the first quantity of the resist is dispensed while the integrated circuit substrate is not spinning;
    ceasing said dispensing of the first quantity of the resist;
    spinning the integrated circuit substrate after ceasing said dispensing of the first quantity of the resist to form a resist layer overlying at least a portion of the integrated circuit substrate; and dispensing a second quantity of the resist on the integrated circuit substrate, wherein the second quantity of the resist is dispensed during said step of spinning the integrated circuit substrate.

18. The method of claim 17, further comprising the step of ceasing said dispensing of the second quantity of the resist.

19. The method of claim 18, further comprising the step of accelerating the integrated circuit substrate to a predetermined spin speed after ceasing said dispensing of the second quantity of the resist.

20. The method of claim 17, wherein the step of dispensing the first quantity of the resist is further characterized as dispensing the first quantity of the resist over the center of the integrated circuit substrate.

21. The method of claim 17, wherein the step of dispensing the second quantity of the resist is further characterized as dispensing the second quantity of the resist over the center of the integrated circuit substrate.

* * * * *

UNITED STATES PATENT AND TRADEMARK OFFICE
CERTIFICATE OF CORRECTION

PATENT NO.    : 6,379,744 B1
DATED         : April 30, 2002
INVENTOR(S)   : Hussain Gouranlou et al.

It is certified that error appears in the above-identified patent and that said Letters Patent is hereby corrected as shown below:

Column 3,
Line 67, insert hyphen in "spinon" between "spin" and "on".

Signed and Sealed this

Twenty-fifth Day of February, 2003

JAMES E. ROGAN
*Director of the United States Patent and Trademark Office*